US010451668B2

(12) United States Patent
Nahum et al.

(10) Patent No.: US 10,451,668 B2
(45) Date of Patent: Oct. 22, 2019

(54) TEST PROGRAM FLOW CONTROL

(71) Applicant: Advantest Corporation, Tokyo (JP)

(72) Inventors: Rotem Nahum, San Jose, CA (US);
Rebecca Toy, San Jose, CA (US);
Boilam Phan, San Jose, CA (US);
Jungtsung Liu, San Jose, CA (US);
Leon Chen, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 35 days.

(21) Appl. No.: 15/582,137

(22) Filed: Apr. 28, 2017

(65) Prior Publication Data

US 2018/0313891 A1 Nov. 1, 2018

(51) Int. Cl.
*G01R 31/28* (2006.01)

(52) U.S. Cl.
CPC ....... *G01R 31/2834* (2013.01); *G01R 31/287* (2013.01)

(58) Field of Classification Search
CPC ............ G01R 31/2834; G01R 31/2863; G01R 31/2889; G01R 31/287; G06F 11/2733
See application file for complete search history.

(56) References Cited

U.S. PATENT DOCUMENTS

| 8,473,275 B2 | 6/2013 | Bartz et al. |
| 8,514,919 B2 | 8/2013 | Estrada et al. |
| 8,725,489 B2 | 5/2014 | Conner |
| 8,805,636 B2 | 8/2014 | Conner |
| 2004/0124860 A1 | 7/2004 | Hamdan |
| 2012/0137186 A1* | 5/2012 | Portolan ........ G01R 31/318533 714/727 |
| 2014/0236527 A1* | 8/2014 | Chan ............. G01R 31/318307 702/119 |
| 2014/0237292 A1* | 8/2014 | Chan ................... G06F 11/2733 714/32 |
| 2015/0028908 A1* | 1/2015 | Kushnick ............ G06F 11/2221 324/750.05 |
| 2016/0003892 A1 | 1/2016 | Blancha et al. |
| 2016/0238657 A1 | 8/2016 | Czamara et al. |

* cited by examiner

*Primary Examiner* — Bryan Bui

(57) ABSTRACT

A system for performing an automated test is disclosed. The system comprises a user computer operable to load a test program from a user to a control server, wherein the test program comprises a plurality of test flows. The system further comprises a tester deploying a plurality of primitives. Further, the control server is communicatively coupled to the user computer and to the tester, wherein the control server is operable to download the test program to a primitive from the plurality of primitives, and wherein the control server is further operable to execute a first test flow from the plurality of test flows on a first DUT within the primitive and concurrently execute a second test flow from the plurality of test flows on a second DUT within the primitive.

19 Claims, 11 Drawing Sheets

TEST PROGRAM FLOW CONTROL

CROSS-REFERENCE TO RELATED APPLICATIONS

Related Applications

The present application is related to U.S. patent application Ser. No. 15/582,316, filed 28 Apr. 2017, entitled "TEST SYSTEM SUPPORTING MULTIPLE USERS USING DIFFERENT APPLICATIONS," naming Rotem Nahum, Rebecca Toy, Padmaja Nalluri, and Leon Chen as inventors. That application is incorporated herein by reference in its entirety and for all purposes.

FIELD OF THE INVENTION

The present disclosure relates generally to the field of automated test equipment and more specifically to techniques of controlling such equipment.

BACKGROUND OF THE INVENTION

Automated test equipment (ATE) can be any testing assembly that performs a test on a semiconductor wafer or die, an integrated circuit (IC), a circuit board, or a packaged device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

When a typical ATE system tests a device (commonly referred to as a device under test or DUT), the ATE system applies stimuli (e.g. electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure.

It is common for an ATE system to include a computer that directs the operation of the ATE system. Typically, the computer runs one or more specialized software programs to provide (i) a test development environment and (ii) a device testing environment. In the test development environment, a user typically creates a test program, e.g., a software-based construct of one or more files that controls various portions of the ATE system. In the device testing environment, the user typically provides the ATE system with one or more devices for testing, and directs the ATE system to test each device in accordance with the test program. The user can test additional devices by simply providing the additional devices to the ATE system, and directing the ATE system to test the additional devices in accordance with the test program. Accordingly, the ATE system enables the user to test many devices in a consistent and automated manner based on the test program.

In a typical prior art testing environment, the DUTs are placed into a controlled environmental chamber or "oven." The DUTs are connected to slices of a test head. Several DUTs can be connected to a single slice and a single testing chamber may contain several slices. The slices contain the test circuitry which performs tests on the DUTs in accordance with a test plan. When in the oven, the DUTs are not user accessible as to not disturb the controlled environment of the chamber. The plurality of slices generally operate in lock step executing the same test plan on the plurality of DUTs. Further, the test head is typically controlled by a single controller computer system that is directly connected to the test head and, in this fashion, controls all of the slices of the test head. The controller computer is typically operated by a single user executing a single test plan on the DUTs.

A problem of this testing environment is that it is often the case that there are not enough DUTs to completely fill the slices of a given test head during each test. The vacant slices during the test, under such a condition, are therefore wasted in that they are not performing any useful work. These vacancies can reduce overall testing throughput because very expensive electronics sit idle. These idle slices cannot be put to different uses because: 1) the inside of the chamber is not accessible during testing; 2) the control computer supports only one user at any time; and 3) the slices (all of them) operate on only one test plan at a time typically devoted to only one type of DUT.

The test chambers are also bulky and expensive. Another drawback of the conventional testing environment is that a typical customer that wants to share the test chamber between several different user groups, e.g., manufacturing, engineering, etc. concurrently in order to fully utilize the testing chamber is unable to do so. Because the test slices, in typical testing environments, can only operate on a single test plan at a time and support only single user experiences, customers are unable to fully utilize a test chamber at any given time and are, therefore, forced to either purchase additional equipment or sacrifice efficiency. In short, conventional test chambers are very inflexible.

BRIEF SUMMARY OF THE INVENTION

Accordingly, a need exists for a testing environment that can be shared between multiple users. Further, what is needed is a test environment that can contain a plurality of tester slices, wherein each of the slices can run an independent test plan or be utilized independently of the remaining slices in the test chamber. Also, what is needed is a test chamber that allows access of the inside of the chamber while tests are running within the chamber so that the chamber can be fully utilized by multiple users at the same time. Finally, what is needed is a testing environment in which the different DUTs within each of the tester slices can run test flows independently of the other DUTs in the system. Using the beneficial aspects of the systems described, without their respective limitations, embodiments of the present invention provide a novel solution to address these problems.

The invention disclosed herein utilizes a plurality of primitives (or tester slices) and associated DUT interface boards (DIBs) to test the DUTs. Each primitive is modular meaning that it is capable of operating independently from other primitives. Therefore, a plurality of primitives set in a rack can each be operating under a different test plan even operating on different DUT types. The primitives communicate with a control server for instructions, control, management, etc. The control server is capable of hosting multiple application programs or test plans for the various primitives it supports. The primitive can communicate with the server via a standard IP network. Various computer systems, which can be located remotely, can access the server via standard IP network connections. In addition, in one embodiment, the environmental chamber is no longer needed when testing DUTs associated with a rack of primitives, therefore advantageously direct user manipulation is allowed with respect to the DUTs and the primitives at any time.

Therefore, under this testing platform, due to: 1) primitive modularity; and 2) use of standard IP network, it is possible for a plurality of primitives to be testing a plurality of DUTs under a given test plan in accordance with one user while a second plurality of primitives of the same rack are performing a completely different application directed by a second user, and so on. Therefore, the problems heretofore associated with idle test circuitry of the prior art are eliminated.

Further, in one embodiment of the present invention, each of the DUTs in any given primitive (or tester slice) is allowed to run a different test flow from the other DUTs in the primitive, thereby, providing the user added flexibility and making the testing process more efficient. In other words, unlike conventional testers that were required to run the same test program and the same test flow on all the DUTs within the tester, embodiments of the present invention permit each of the DUTs within a primitive (or tester slice) to run a different test flow from the other DUTs within the same primitive.

In one embodiment, a system for performing an automated test is disclosed. The system comprises a user computer that is operable to load a test program from a user to a control server, wherein the test program comprises a plurality of test flows. The system further comprises a tester deploying a plurality of primitives. Further, the control server is communicatively coupled to the user computer and to the tester, wherein the control server is operable to download the test program to a primitive from the plurality of primitives, and wherein the control server is further operable to execute a first test flow from the plurality of test flows on a first DUT within the primitive and concurrently execute a second test flow from the plurality of test flows on a second DUT within the primitive.

In another embodiment, a system for performing an automated test is disclosed. The system comprises a user computer operable to load a test program from a user to a control server, wherein the test program comprises a plurality of test flows. The system further comprises a tester deploying a plurality of tester slices. Further, the control server is communicatively coupled to the user computer and to the tester, wherein the control server is operable to download the test program to a tester slice from the plurality of tester slices, and wherein the control server is further operable to concurrently execute a different test flow on each DUT within the tester slice.

In a different embodiment, a method for performing tests using automated test equipment (ATE) is disclosed. The method comprises loading a test program to a control server from a user computer, wherein the control server communicates with a plurality of primitives in a tester, and wherein the test program comprises a plurality of test flows. The method also comprises downloading the test program to a primitive from the plurality of primitives and executing a first test flow from the plurality of test flows on a first DUT within the primitive. Finally, the method comprises concurrently executing a second test flow from the plurality of test flows on a second DUT within the primitive.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

Figure 1A:
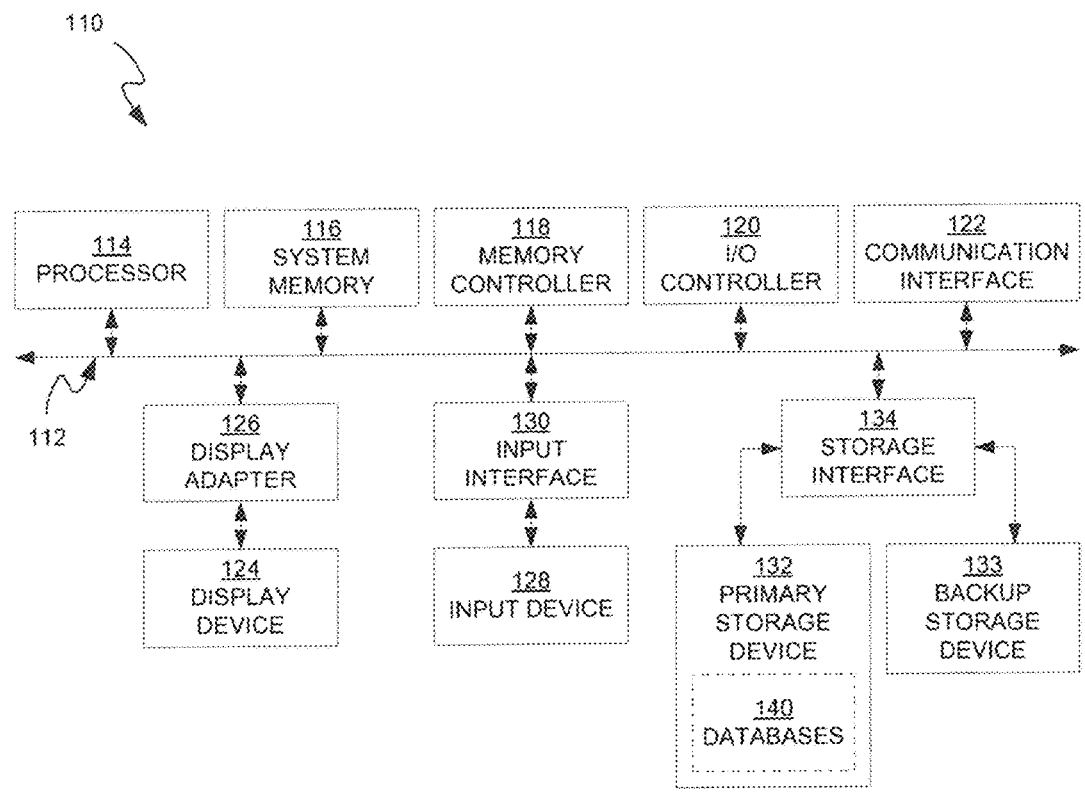
FIG. 1A is a computer system on which embodiments of the automated test system of the present invention can be implemented in accordance with one embodiment of the present invention.

In the figures, elements having the same designation have the same or similar function.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure.

However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "configuring," "providing," "executing," "transmitting," "obtaining," "implementing," "programming," "allocating," "associating," "setting," "accessing," "controlling," "determining," "identifying," "caching," "maintaining," "comparing," "removing," "reading," "writing," or the like, refer to actions and processes (e.g., flowchart 800 of FIG. 8) of a computer system or similar electronic computing device or processor (e.g., system 110 of FIG. 1A). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Figure 5:
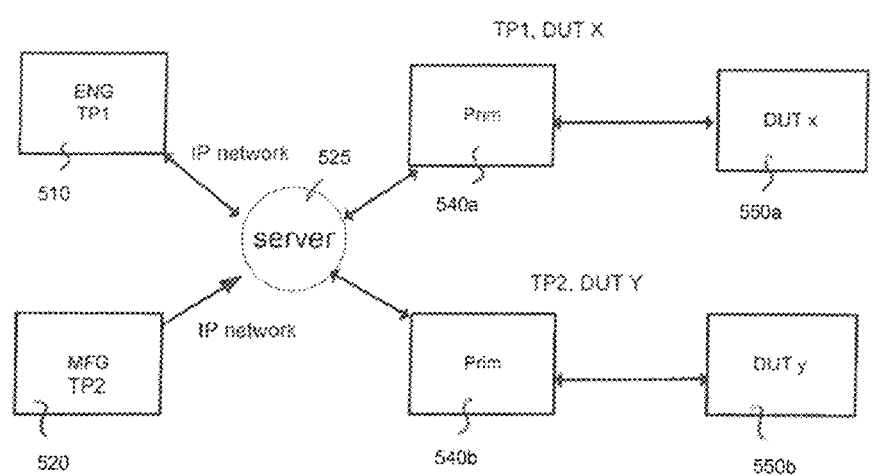
FIG. 5 illustrates a test system that supports multiple users using different applications in accordance with an embodiment of the invention.

FIG. 1A is a block diagram of an example of a tester control system 110 capable of supporting multiple users with different applications. In an embodiment, system 110 controls the operation of the primitives of the present invention. For example, system 110 may perform the functions of server 525 (as shown in FIG. 5). Tester control system 110 broadly represents any single or multi-processor computing device or system capable of executing computer-readable instructions. Examples of control system 110 include, without limitation, workstations, laptops, client-side terminals, servers, distributed computing systems, handheld devices, or any other computing system or device. In its most basic configuration, control system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments control system 110 may include both a volatile memory unit (such as, for example, system memory 116) and a non-volatile storage device (such as, for example, primary storage device 132).

Tester control system 110 may also include one or more components or elements in addition to processor 114 and system memory 116. For example, in the embodiment of FIG. 2A, control system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of control system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of control system 110, such as processor 114, system memory 116, communication interface 122, display adapter 126, input interface 130, and storage interface 134.

Communication interface 122 broadly represents any type or form of communication device or adapter capable of facilitating communication between example control system 110 and one or more additional devices. For example, communication interface 122 may facilitate communication between control system 110 and a private or public network including additional control systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between control system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow control system 110 to engage in distributed or remote computing. For example, communication interface 122 may receive instructions from a remote device or send instructions to a remote device for execution.

As illustrated in FIG. 1A, control system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1A, control system 110 may also include at least one input device 128 coupled to communication infrastructure 112 via an input interface 130. Input device 128 generally represents any type or form of input device capable of providing input, either computer- or human-generated, to control system 110. Examples of input device 128 include, without limitation, a keyboard, a pointing device, a speech recognition device, or any other input device.

As illustrated in FIG. 1A, control system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of control system 110.

In one example, databases 140 may be stored in primary storage device 132. Databases 140 may represent portions of a single database or computing device or it may represent multiple databases or computing devices. For example, databases 140 may represent (be stored on) a portion of control system 110 and/or portions of example network architecture 200 in FIG. 2 (below). Alternatively, databases 140 may represent (be stored on) one or more physically separate devices capable of being accessed by a computing device, such as control system 110 and/or portions of network architecture 200.

Continuing with reference to FIG. 1A, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into control system 110. For example, storage devices 132 and 133 may be configured to read and write software, data, or other computer-readable information. Storage devices 132 and 133 may also be a part of control system 110 or may be separate devices accessed through other interface systems.

Many other devices or subsystems may be connected to control system 110. Conversely, all of the components and devices illustrated in FIG. 1A need not be present to practice the embodiments described herein. The devices and subsystems referenced above may also be interconnected in different ways from that shown in FIG. 1A. Control system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into control system 110. All or a portion of the computer program stored on the computer-readable medium may then be stored in system memory 116 and/or various portions of storage devices 132 and 133. When executed by processor 114, a computer program loaded into control system 110 may cause processor 114 to perform and/or be a means for performing the functions of the example embodiments described and/or illustrated herein. Additionally or alternatively, the example embodiments described and/or illustrated herein may be implemented in firmware and/or hardware.

Figure 1B:
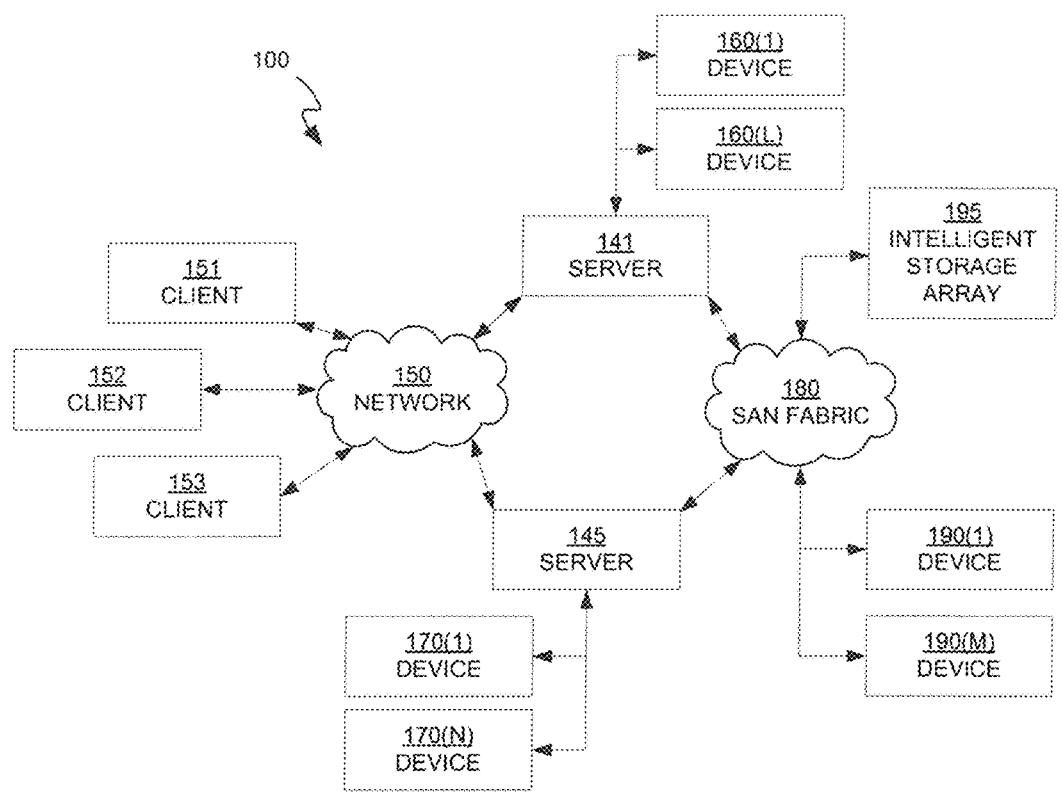
FIG. 1B is a block diagram of an example of a network architecture in which client systems and servers may be coupled to a network, according to embodiments of the present invention.

FIG. 1B is a block diagram of an example of a network architecture 100 in which client systems 151, 152 and 153 and servers 141 and 145 may be coupled to a network 150. Client systems 151, 152 and 153 generally represent any type or form of computing device or system, such as tester control system 110 of FIG. 1A.

Similarly, servers 141 and 145 generally represent computing devices or systems, such as application servers or database servers, configured to provide various database services and/or run certain software applications. Network 150 generally represents any telecommunication or computer network including, for example, an intranet, a wide area network (WAN), a local area network (LAN), a personal area network (PAN), or the Internet.

With reference to control system 110 of FIG. 2A, a communication interface, such as communication interface 122, may be used to provide connectivity between each client system 151, 152 and 153 and network 150. Client systems 151, 152 and 153 may be able to access information on server 141 or 145 using, for example, a Web browser or other client software. Such software may allow client systems 151, 152 and 153 to access data hosted by server 140, server 145, storage devices 160(1)-(L), storage devices 170(1)-(N), storage devices 190(1)-(M), or intelligent storage array 195. Although FIG. 2A depicts the use of a network (such as the Internet) for exchanging data, the embodiments described herein are not limited to the Internet or any particular network-based environment.

In one embodiment, all or a portion of one or more of the example embodiments disclosed herein are encoded as a computer program and loaded onto and executed by server 141, server 145, storage devices 160(1)-(L), storage devices 170(1)-(N), storage devices 190(1)-(M), intelligent storage array 195, or any combination thereof. All or a portion of one or more of the example embodiments disclosed herein may also be encoded as a computer program, stored in server 141, run by server 145, and distributed to client systems 151, 152 and 153 over network 150.

Test System Supporting Multiple Users Using Different Applications

Figure 2:
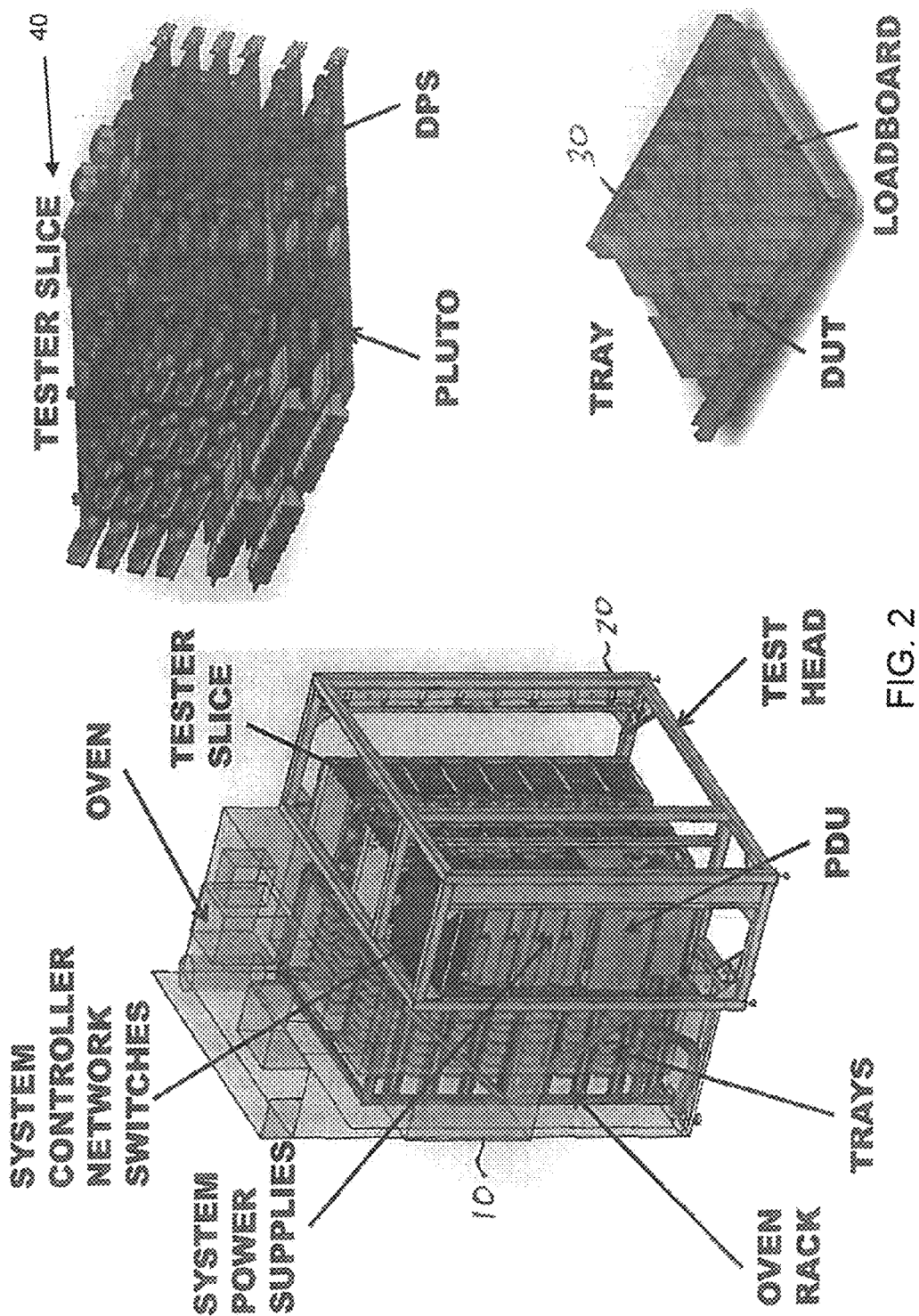
FIG. 2 illustrates a typical testing environment in which DUTs are placed into a controlled environmental chamber.

FIG. 2 illustrates a typical testing environment in which DUTs are placed into a controlled environmental chamber 10 or "oven." The DUTs are connected to tester slices of a test head 20. Many DUTs can be connected to a single tester slice 40. The tester slices (discussed in further detail in connection with FIG. 4) contain the test circuitry, which performs tests on the DUTs in accordance with a test plan. There can be many tester slices per test head 20. The DUTs are placed into trays 30 when inserted into the oven 10. When in the oven 10, the DUTs are typically not user accessible so as to not disturb the controlled environment of the chamber 10. In a typical environmental chamber, the plurality of tester slices operate in lock step executing the same test plan on the plurality of DUTs. Further, the test head is typically controlled by a single controller computer system (not shown) that is directly connected to the test head and, in this fashion, controls all of the slices of the test head 20. The controller computer is typically operated by a single user executing a single test plan on the DUTs.

A problem of this testing environment is that it is often the case that there are not enough DUTs to completely fill the tester slices of a given test head during each test. The vacant slices during the test, under such a condition, are therefore wasted in that they are not performing any useful work. This can reduce overall testing throughput and very expensive electronics sit idle. These idle slices cannot be put to different uses because: 1) the inside of the chamber is not accessible during testing; 2) the control computer supports only one user at any time; and 3) the slices (all of them) operate on only one test plan at a time.

The test chambers are also typically bulky and expensive. Another drawback of the testing environment is that a typical customer that wants to share the test chamber between several different user groups, e.g., manufacturing, engineering, etc. concurrently in order to fully utilize the testing chamber is unable to do so. Because the test slices, in typical testing environments, can only operate on a single test plan at a time and support only single user experiences, customers are unable to fully utilize a test chamber at any given time and are, therefore, forced to either purchase additional equipment or sacrifice efficiency.

Figure 3:
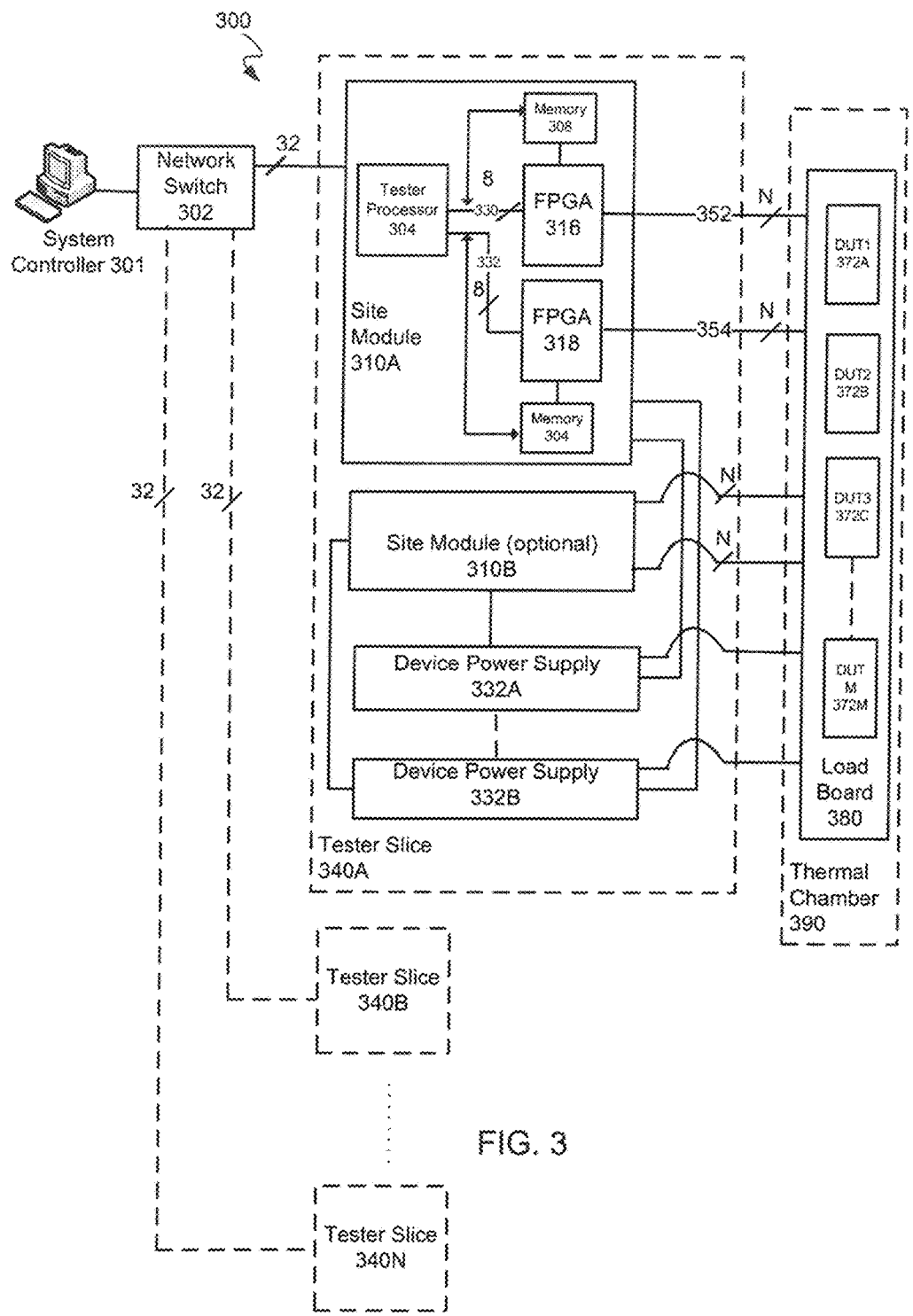
FIG. 3 is a detailed schematic block diagram illustrating an exemplary embodiment of a tester slice and its interconnections with the system controller and the DUTs.

FIG. 3 is a detailed schematic block diagram illustrating an exemplary embodiment of a tester slice and its interconnections with the system controller and the DUTs.

Referring to FIG. 3, each tester slice comprises site modules. The site modules, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. Network switch 302 can be connected to each of the site modules with a 32 bit wide bus.

In one embodiment, the system controller 301 may be a computer system, e.g., a personal computer (PC) that provides a user interface for the user of the ATE to load the test programs and run tests for the DUTs connected to the ATE 300. The Advantest Stylus™ Operating System is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 301 can be connected to the site module boards 310A-310B through a network switch, such as an Ethernet switch. In other embodiments, the network switch may be compatible with a different protocol such as Fibre Channel, 802.11 or ATM, for instance.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3 is controlled by the tester processor 304. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 304 respectively. The memory modules can be coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT.

It should be noted that FIG. 3 only illustrates an exemplary embodiment of a tester slice. Further, note that embodiments of the present invention are not limited to only the type of tester slices shown in FIG. 3. Embodiments of the present invention can include may different types of tester slices and primitives as will be discussed further below.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

Figure 4A:
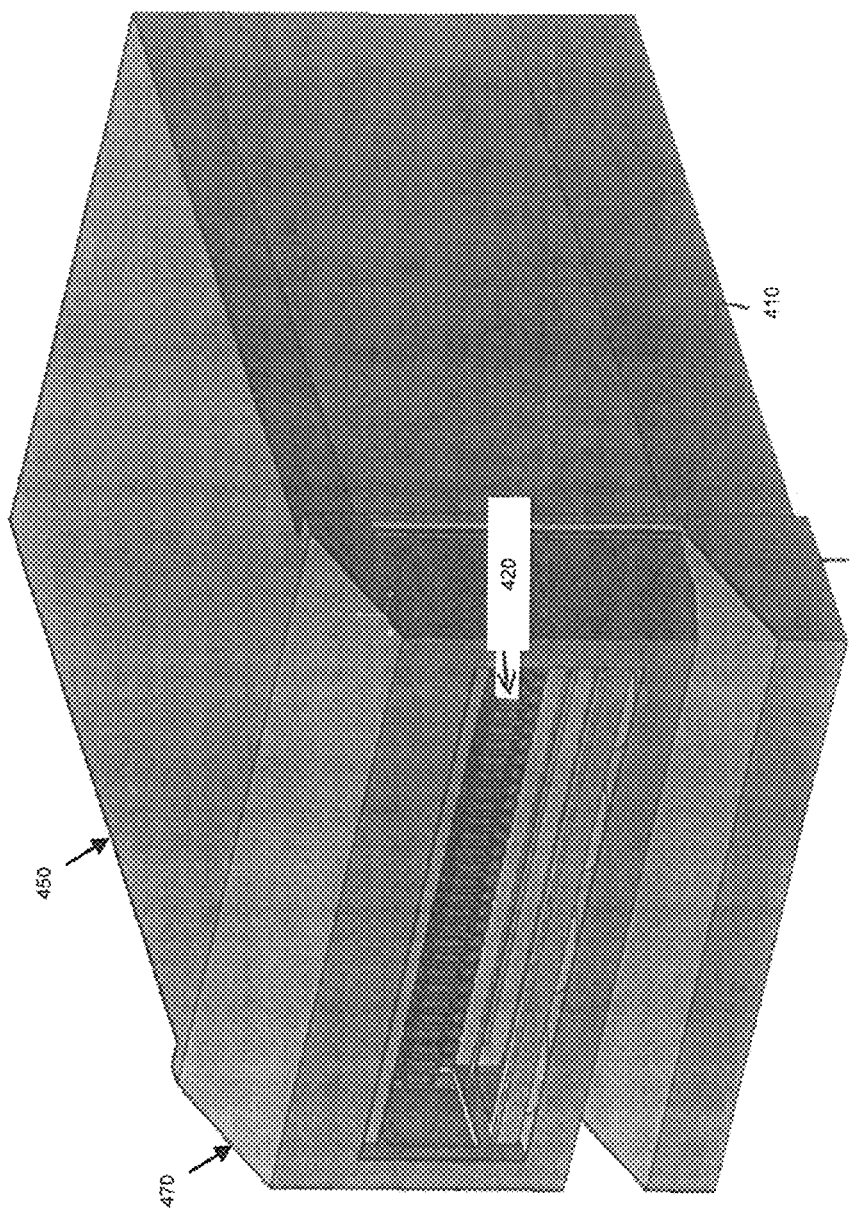
FIG. 4A illustrates a primitive interfaced with a DUT Interface Board (DIB) 400 in accordance with an embodiment of the invention.

FIG. 4 illustrates a primitive 410 interfaced with a DUT Interface Board (DIB) 400 in accordance with an embodiment of the invention. Similar to the tester slice 40 shown in FIG. 2, the primitive of FIG. 4 is a type of discrete test module that fits into test head 20 and comprises the test circuitry, which performs tests on the DUTs in accordance with a test plan. A primitive comprises an enclosure 450 within which all the various electronics e.g., site modules, power supplies, etc. are housed. The DIB 400 can contain a plurality of DUTs 420 using custom connectors sized for the DUTs 420. The DIB 400 can also comprise an enclosure 470. The DIB 400 interfaces to a universal backplane (not shown) of the primitive 410 through a load board (not shown) similar to load board 380 shown in FIG. 3. The primitive 410 contains test circuitry (similar to tester slice 340A shown in FIG. 3) for performing a test plan on the DUTs 420. The primitive 410 can operate independently of any other primitive and is connected to a control server (similar to system controller 301 shown in FIG. 3).

Figure 4B:
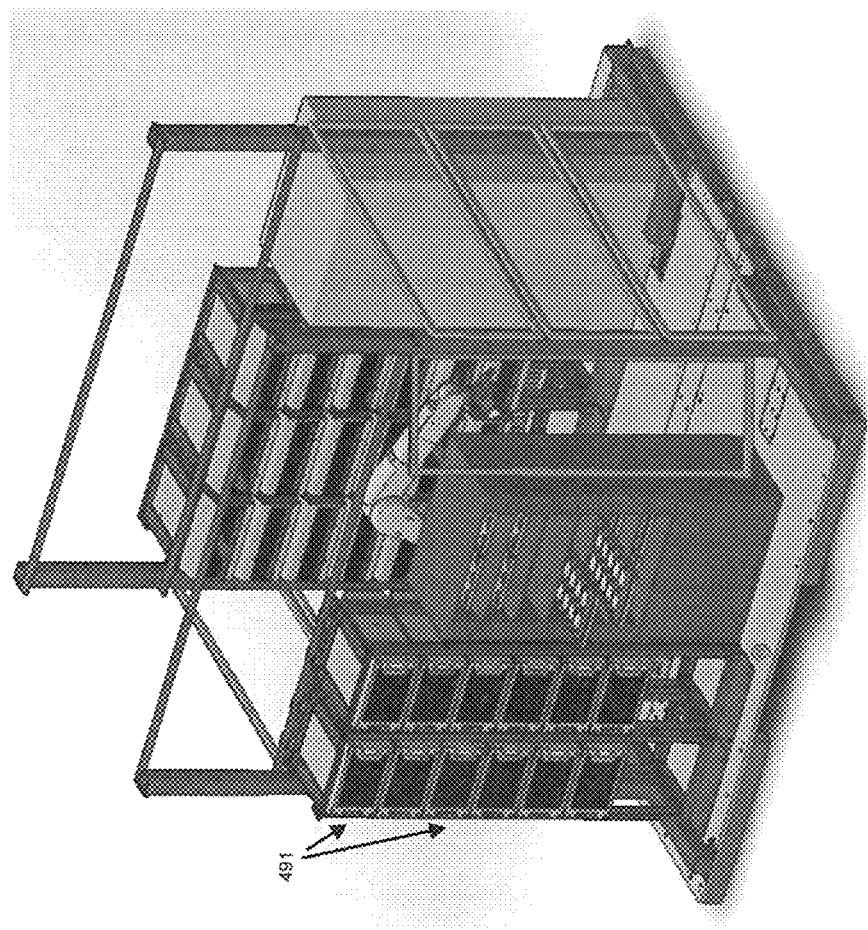
FIG. 4B illustrates a work-cell comprising a plurality of primitives.

FIG. 4B illustrates a work-cell comprising a plurality of primitives 491. Embodiments of the present invention utilize a plurality of primitives (similar to the primitive shown in FIG. 4B) and associated DIBs to test the DUTs. Embodiments of the present invention can also use tester slices (similar to tester slice 40 in FIG. 2) to test the DUTs. Each primitive (or tester slice) is modular meaning that it is capable of operating independently from other primitives (or tester slices). Therefore, a plurality of primitives set in a rack (as shown in FIG. 4B) can each be operating under a different test plan. The primitives communicate with a control server for instructions, control, management, etc. The control server is capable of hosting multiple application programs or test plans for the various primitives it supports. The primitive can communicate with the server via a standard IP network. Various computer systems, which can be located remotely, can access the server via standard IP network connections.

Therefore, under this testing platform, due to: 1) primitive modularity; and 2) use of standard IP network connections, it is possible for a plurality of primitives or tester slices to be testing a plurality of DUTs under a given test plan in accordance with one user while a second plurality of primitives of the same rack are performing a completely different application (or different test plan) directed by a second user, and so on. Therefore, the problems heretofore associated with idle test circuitry of conventional test systems are eliminated. For example, in a test head comprising 6 primitives, it may be possible for 2 of the primitives to be dedicated to an engineering department for debugging SATA type devices while 4 of the primitives may be dedicated for volume testing of SSD drives by a manufacturing department.

In one embodiment, if the test system uses the primitives shown in FIG. 4, the environmental chamber is no longer needed when testing DUTs associated with a rack of primitives because the primitives are designed to be partitioned in an efficient way. In this embodiment, the enclosure 450 for the primitive allows the heat from the DUTs to be retained inside the enclosure and, therefore, a separate heating chamber is not required. As a result, direct user manipulation is allowed with respect to the DUTs and the primitives at any time. In other words, the DUTs supply the heat (when powered up for longer durations within the enclosure) that is needed to test the DUTs at higher temperatures. Further, the primitive enclosure 450 may contains fans and/or vents to allow air to circulate inside the primitive to cool the DUTs and, consequently, lower the internal temperature of the primitive.

In a different embodiment, if the test system uses tester slices shown in FIG. 2, an environmental chamber is still needed, but the modularity of the system allows different users to have exclusive control of individual sections of the environmental chamber. Therefore, direct user manipulation is allowed with respect to the DUTs and the tester slices at any time. For example, a first user could be running a test in the environmental chamber with a first set of tester slices while a second user could manipulate the DUTs within a second set of tester slices that is under his exclusive control.

FIG. 5 illustrates a test system 500 that supports multiple users using different applications in accordance with an embodiment of the invention. As shown in FIG. 5, a control server 525 is in communication with different primitives 540a and 540b. These two primitives can be located within a single rack (as shown in FIG. 4B). Note, that while the exemplary test system of FIG. 5 uses primitives, the principles of the present invention are equally applicable to a test system using tester slices as well.

Primitive 540a is shown testing a plurality of DUTs 550a (via a DIB) using a test plan "TP1." Primitive 540b is shown testing a plurality of DUTs 550b (via a DIB) using a separate application, called test plan "TP2." Over two different standard IP network connections, a first user computer 510 and a second user computer 520 are both connected to the control server 525.

For example, a first user computer could be dedicated to the engineering department of a customer while a second user computer could be dedicated to the manufacturing department. These user computers can be remote from one another and can be remote from the server 525. It is appreciated that many more primitives and/or tester slices can be in communication with the server 525 and only two are shown for illustration.

In the example shown in FIG. 5, the second user computer 520 is controlling a manufacturing test plan on the plurality of DUTs 550b via execution by primitive 540b. This manufacturing test plan can be loaded to the control server 525 and then downloaded to the primitive 540b for execution on the DUTs 550b. Testing results can then be communicated in the opposite direction. In this example, the user computer 520 can be under control of a production specialist during volume manufacturing testing of DUTs 550b.

In this way, embodiments of the present invention can support completely different functionalities using the same tester. For example, during manufacturing testing, the tester may be running a fixed workflow using a subset of the primitives within the test head. By way of example, a manufacturing workflow may comprise bar-coding SSD drives, testing them, and tagging them as "Pass" or "Fail." At the same time, a member of the engineering team could be performing an entirely different function such as debugging fail results for SATA drives using a different set of primitives within the test head.

Coincidentally with the above testing, the first user computer 510 can control an engineering test plan for application to the plurality of DUTs 550a via primitive 540a. The engineering test plan can be a test plan under development that has not yet been finalized. Alternatively, the engineering test plan can merely be a different type of manufacturing test plan for testing different DUTs using different protocols, e.g., DUT type x versus DUT type y. This engineering test plan can be loaded to the control server 525 and then downloaded to the primitive 540a for execution on the DUTs 550a. Testing results can then be communicated in the opposite direction. In this example, the user computer 510 can be under control of a test engineer developing a test plan that is currently under prototype for future use.

In one embodiment, user computers 510 and 520 can, in one embodiment, be system controllers running testing software, e.g., Advantest Stylus™. In a different embodiment, user computers 510 and 520 can be user terminals connected through a communication network, e.g., IP network to server 525, wherein server 525 is a system controller running the testing software, e.g., Advantest Stylus™.

In one embodiment, the server 525 is a controller that monitors testing for all the connected primitives (or tester slices) and also provides a GUI to the user. In other embodiments, the user connects to the server through IP connections as shown in FIG. 5, wherein each of the user computers connected to the server provides a separate GUI to an associated user to control the associated set of primitives.

The server 525, in one embodiment, can execute an allocation scheme that allocates the resources between the users. For example, the server can allocate primitives and/or tester slices to a user depending on the user's application. In one embodiment, the server can dynamically allocate and manage different primitives and/or tester slices for different purposes to different users. The server also allows for bi-directional communication between each of the user computers and the various primitives (and their associated DUTs) connected to the server 525. The server can also manage the simultaneous workflows executing on the various connected primitives and track the various workflows on the connected primitives and/or tester slices.

Note that embodiments of the present invention advantageously can be used to test different types of devices (including different size, type and form factors) at the same time using the same test head 20. For example, the same tester can be used to test SATA drives and SSD drives at the same time using different primitives or tester slices.

Further, different test plans can be run for each of the different types of devices being tested or for each primitive or tester slice within the test head. This advantageously allows a single customer to use a single tester for a plurality of functions in parallel and, obviates the need for a dedicated tester for each function. In order to support embodiments of the present invention, the tester software, in one embodiment, will have the ability to load multiple test programs at the same time, wherein each test program may execute on a different primitive at the same time. For example, a user may be able to load one test program per group, wherein a group is defined as all the DUTs on one tray slot. The tester software can, in one embodiment, have the ability to support as many concurrently executing test programs as there are primitives in the tester system.

Therefore, assuming primitive 540a represents a plurality of primitives testing a plurality of DUTs, it is possible for a second plurality of primitives 540b, of the same rack, to be used for different purposes by different users thereby eliminating any idle components. More specifically, while a first test is being performed on DUTs 550a by the engineering team, the manufacturing team could be advantageously using primitive 550b in parallel to ready for a subsequent test for use at a later time.

Because standard IP network communication is used between the control server 525 and the user computers, multiple user computers can be accessing the control server 525 at any time, and can be remote. This allows for multiple different test plans to be loaded into the various primitives of the rack and run independently of each other via server control by different users.

In the embodiment where the environmental chamber is eliminated because of the design of the primitives, primitive 540a can be directly manually interacted with while the test plan of primitive 540b is in operation, and vice-versa.

Similarly, even in the embodiment with tester slices where an environmental chamber is still used, different users may have exclusive control of individual sections of the environmental chamber because the tester slices can be used independently of each other.

Advantages of the invention include greater tester flexibility in that each primitive can operate independently. Another advantage of the invention is increased tester efficiency due to the elimination of idle test circuitry. Another advantage of the invention is that multiple users can be executing different test plans on different DUTs at the same time within a given rack of primitives.

Test Program Flow Control

Figure 6:
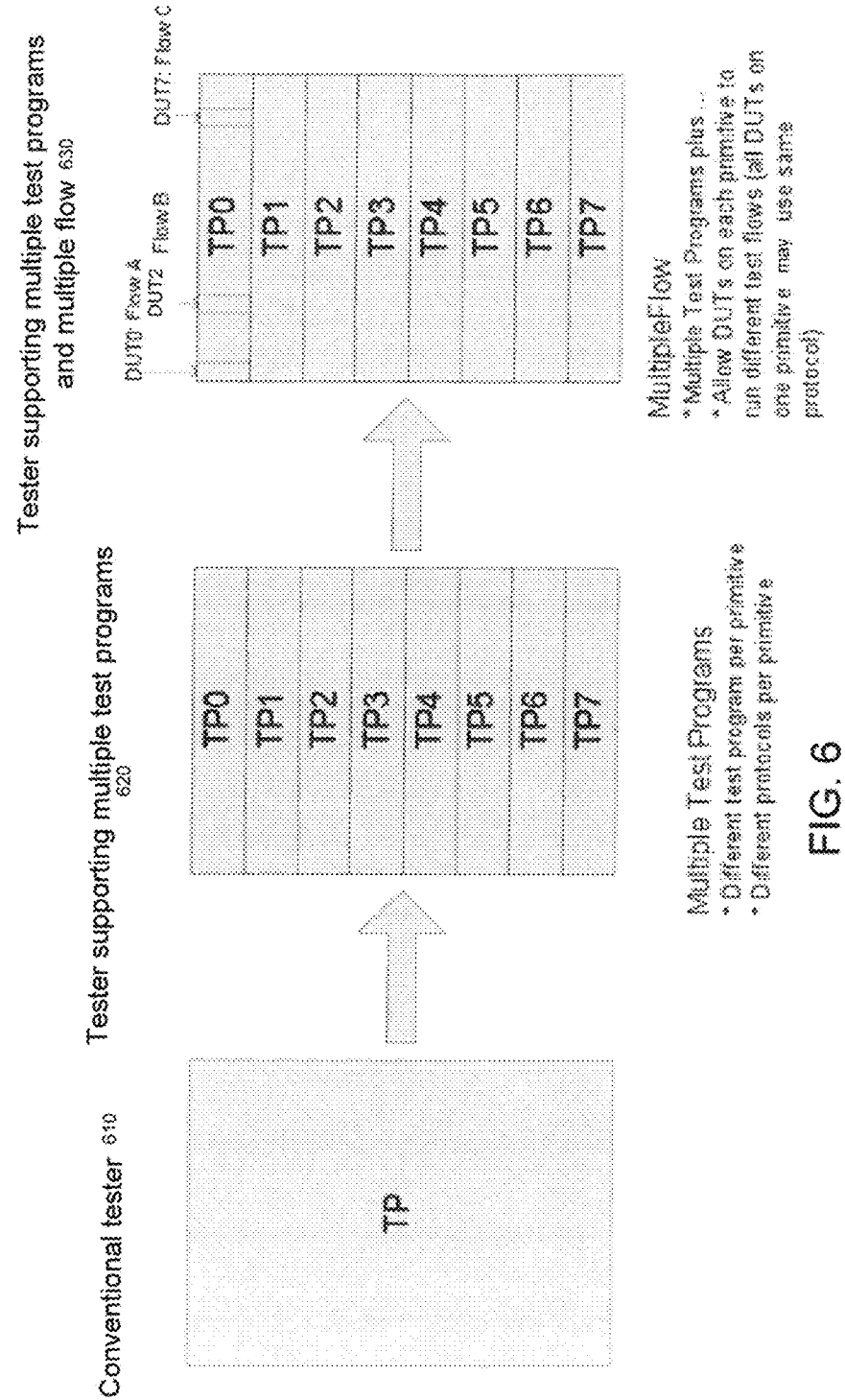
FIG. 6 is a high-level overview illustrating the novel improvements that embodiments of the present invention provide over conventional testers.

In one embodiment, a user can run different test flows on each of the DUTs connected to a primitive or tester slice. FIG. 6 is a high-level overview illustrating the novel improvements that embodiments of the present invention provide over conventional testers.

As shown in FIG. 6 and discussed above, conventional testers were limited because they could only run a single test plan (or test program) on all the tester slices included inside the test head.

Further, as detailed above, embodiments of the present invention improve upon conventional testers, in part, as a result of: 1) primitive modularity; and 2) use of standard IP network connections. Therefore, as shown in FIG. 6, it is possible for a plurality of primitives or tester slices to be testing a plurality of DUTs under a given test plan in accordance with one user while a second plurality of primitives of the same rack are performing a completely different application (or different test plan) directed by a second user, and so on. For example, if tester 620 contained 8 primitives, each of the primitives is capable of running a different test program (TP0, TP1 . . . TP8). Further, each of the primitives can test DUTs executing different protocols, e.g., one primitive or set of primitives can test SSD drives while another primitive or set of primitives can test SATA drives.

Embodiments of the present invention also improve upon conventional tester by allowing a user to run different test flows on each of the DUTs connected to a primitive (or tester slice). While all DUTs connected to the same primitive may execute the same protocol, embodiments of the present invention allow the DUTs on each primitive to run different test flows. As shown in tester 630 in FIG. 6, DUT0 connected to the primitive running test program TP0 executes Flow A, DUT2 executes Flow B and DUT7 executes Flow C. In other words, each DUT within a primitive can run its own test flow and is not required to run the same test flow as all the other DUTs within the primitive.

Figure 7:
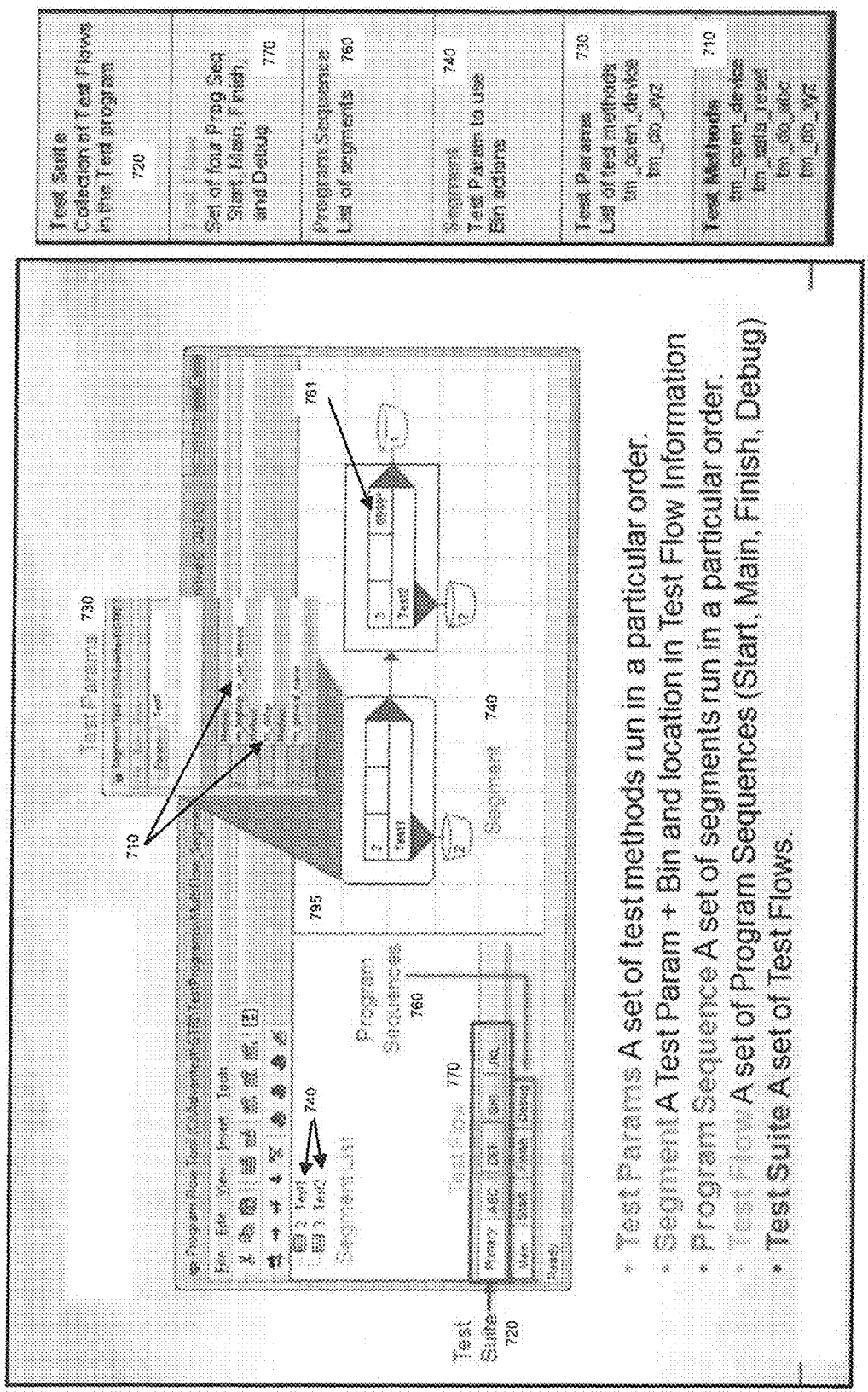
FIG. 7 illustrates the various components of a test program in accordance with an embodiment of the present invention.

FIG. 7 illustrates the various components of a test program in accordance with an embodiment of the present invention. A test program is typically comprised of two files: a Standard Test Interface Language (STIL) and a Test Methods (.so) file. The Test Methods (.so) file typically contains the computer code that will run on the tester site module to directly test the DUTs. The STIL file, on the other hand, comprises information on how the test methods are organized to create a test program (among other configuration information).

The test methods comprise the basic building blocks of the test program. For example, as shown in FIG. 7, the test methods 710 can comprise operations to open a device, performed a reset on a DUT, or any other test-related operation. The test methods communicate directly with the DUT. The test methods are organized in the STIL file in a hierarchy that will be detailed below using FIG. 7.

In one embodiment of the present invention, the test methods are invoked in a Test Parameter 730. Test Parameter 730 is a set of test methods that are run in a particular order. A Test Parameter typically comprises a list of test methods.

A Test Segment 740 is typically associated with a single Test Parameter 730. A Test Parameter 730 can be invoked in a Test Segment. Note that the same Test Parameter can be used in multiple segments. Also, further note that a test segment comprises the bin information for the DUTs as well as a Test Parameter. A bin number may be related to the physical bin the DUTs belong to. Accordingly, a test segment ties the test methods in the Test Parameter to the physical DUTs that the test methods from the Test Parameter are supposed to be run on. Multiple test segments can be combined to make a program sequence.

A program sequence 760 is a set of segments run in a particular order. There are four different Program Sequences: (a) Start—Pre-processing steps (b) Main—Actual testing steps (c) Finish—Post-processing steps, e.g., powering off device, clean up etc. and (d) Debug—Segments that can be run manually for debugging purposes (may be optional). All test programs have a Start, Main, Finish program sequence. There is also an optional Debug program sequence available for debugging purposes.

Conventional testers typically only allows one set of program sequences per STIL file. In one embodiment of the present invention, a Test Flow construct is defined within the tester software (e.g., Advantest Stylus™) that comprises the set of four program sequences. For example, as shown in FIG. 7, Test Flow ABC comprises the four program sequences Start, Main, Finish and Debug. Similarly, Test Flow DEF also comprises the four program sequences Start, Main, Finish and Debug. Further, a Test Suite construct is created. A Test Suite 720 is defined as a collection of Test Flows.

In one embodiment of the present invention a user is advantageously able to define a plurality of test flows within one STIL file. Embodiments of the present invention improve upon conventional tester by allowing a user to define a plurality of test flows within one STIL file and running different test flows on each of the DUTs connected to a primitive (or tester slice). Each DUT in a primitive may run one of the defined test flows within the STIL file. While all DUTs connected to the same primitive may execute the same protocol and be under the control of the same user, embodiments of the present invention allow the DUTs on each primitive to run different test flows. Accordingly, embodiments of the present invention allow per DUT flexibility (in addition to the per primitive flexibility described above). Further, embodiments of the present invention allow each to device to have multiple insertions, wherein every insertion requires a different test flow. The STIL file is configured to handle all the insertions.

By allowing each of the DUTs in a primitive to be at different points or stages during the testing process, embodiments of the present invention advantageously make testing more efficient than conventional testers that only allowed a single test flow in one test program. Conventional testers were restricted to running the same test flow on all the DUTs within a tester. Without support for multiple test flows, both manufacturing and engineering processes are generally more complicated because resources cannot be used as efficiently.

Embodiments of the present invention therefore allow different test methods to be run on different DUTs at any given time, which allows a user to utilize the tester resources fully. Without the ability to support multiple test flows, DUTs at different stages of the testing process would need to be separated out between several testers. By way of example, consider that each DUT in a tester needs to run three different test programs. In the past, the customer would need to load the first test program and let all the DUTs in the tester finish prior to starting the second test program. After the first test program is run to completion, the user would then need to load the second test program and let all the devices finish to completion, etc.

Using embodiments of the present invention, the customer could consolidate each of the three test programs into a single test flow in a multi-flow STIL file. Then, if DUT 12 finishes long before DUT 0, the customer could run the second test flow for DUT 12 while DUT 0 is still in the middle of executing the first test flow. Thus, embodiments of the present not only allow a customer to run different test programs on each primitive, but also the customer is allowed to run different test programs on each DUT. Accordingly, embodiments of the present invention offer the users a great deal of flexibility and helps make more efficient use of system resources.

In one embodiment, a user may be able to combine two existing STIL files. Because all the Test Flows defined in a STIL file rely on the same set of test methods (e.g. Test Methods 710), the user would have to ensure all of the test methods available in the Test Methods (.so) file for each individual test program would also be available in the Test Methods file for the combined test program.

Embodiments of the present invention also allow for Graphical User Interface (GUI) editing of the test flows. For example, as shown in FIG. 7, the GUI has tabs for the various test flows, e.g., Primary, ABC, DEF, GHI, etc. Further, each flow has a separate tab for each of the program sequences within that flow, e.g., Start, Main, Finish, Debug as shown in FIG. 7. In the example of FIG. 7, test flow window 795 shows the Main sequence for Test Flow Primary. The Main sequence contains the actual testing steps for the Test Flow Primary. Embodiments of the present invention allow for editing of the test flows using the GUI shown in the example of FIG. 7. In order to edit the Main sequence for Test Flow Primary, for example, the user can graphically edit the segments shown in test flow window 795.

Embodiments of the present invention also allow for GUI running of the test flows. When running the test program from the GUI, the user can choose to run one Test Flow or the entire Test Suite. To run a particular Test Flow, the user selects the Test Flow that she would like to run. Then the user can start running the test program. The selected flow will be run for all DUTs selected in the DUT tool. To run the Test Suite, the user can select the DUTs on which he wants the program to run and then hit the run button in the DUT tool in the GUI. When running the test suite, if there are any failures, the test suite can stop running, and the GUI will report the failure (subsequent flows will not be run on a failure).

Embodiments of the present invention also allow for execution order numbering. Each of the test flows is based on underlying segments as discussed above. Embodiments of the present invention assign each of the segments with an identification number. This provides users with better visibility into the test progress. During run time, the users are allowed to determine what step the test is in using the identification numbers. The execution number 761, as shown in FIG. 7, can be edited by the user. Further, the execution number is optional, not every segment requires an execution number. If the execution number is not defined, it will not be displayed.

In one embodiment, the tester software supports certain runtime steps. For example, for each device, the tester software may automatically determine which test flow to run on a DUT. When the test flow ends, the automated system may also decide whether to continue with the next test flow or finish the testing process on the associated DUT.

Figure 8:
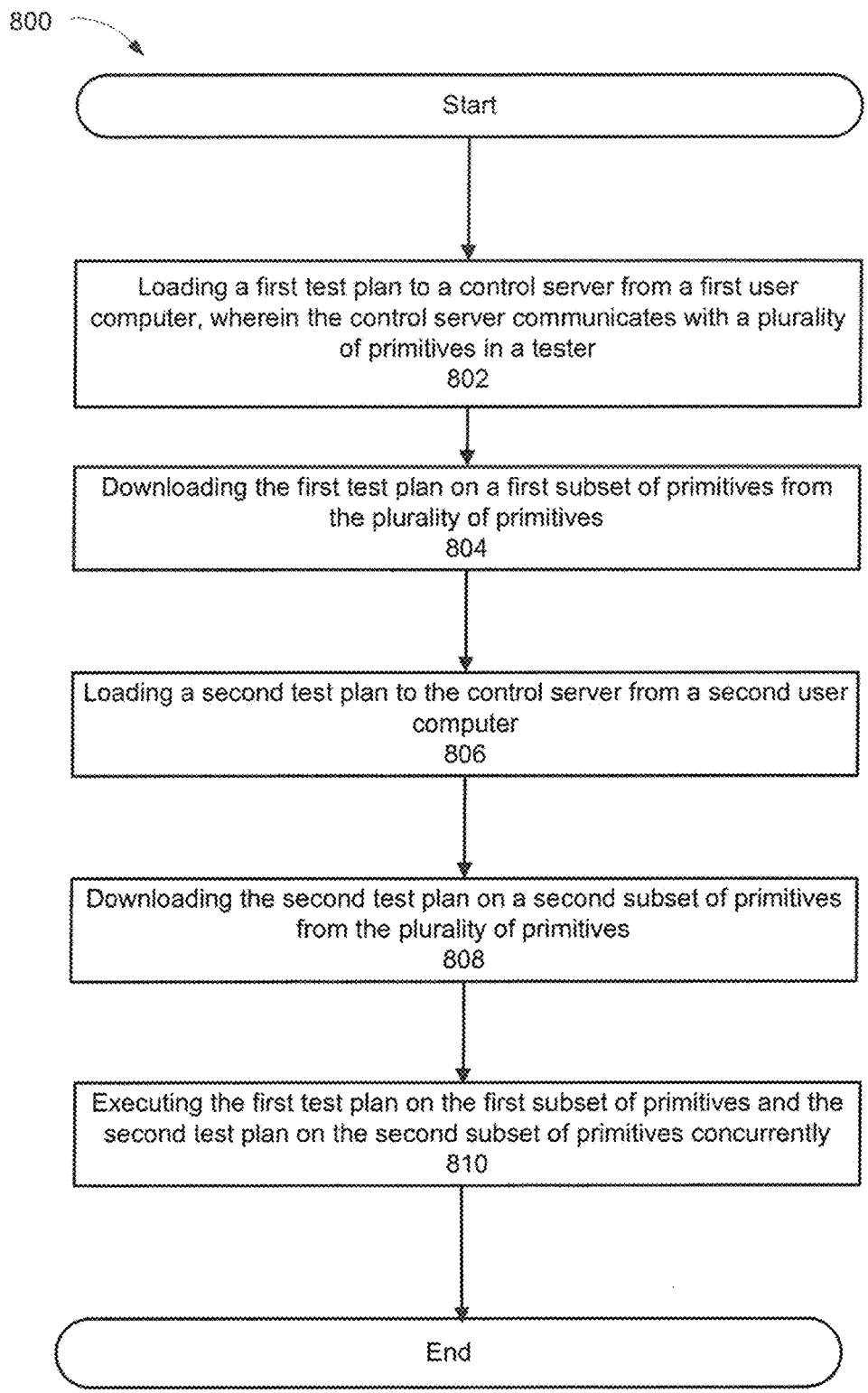
FIG. 8 illustrates a flowchart of an exemplary computer implemented process for running multiple test programs on the same tester concurrently in accordance with one embodiment of the present invention.

FIG. 8 illustrates a flowchart of an exemplary computer implemented process for running multiple test programs on the same tester concurrently in accordance with one embodiment of the present invention. The invention, however, is not limited to the description provided by flowchart 800. Rather, it will be apparent to persons skilled in the relevant art(s) from the teachings provided herein that other functional flows are within the scope and spirit of the present invention. Flowchart 800 will be described with continued reference to exemplary embodiments described above, though the method is not limited to those embodiments.

At step 802, a first test plan is loaded to a control server, e.g., server 525 from a first user computer, e.g., user computer 510, wherein the control server is in communication with a plurality of primitives in a tester. As mentioned above, embodiments of the present invention also apply to tester slices. The control server will typically be running tester software, e.g., Advantest Stylus™ Operating System that allows it to communicate with the primitives and to run test plans on the DUTs inside the primitive.

At step 804, the first test plan is downloaded on a first set of primitives from the plurality of primitives for execution on the DUTs associated with the first set of primitives. As mentioned in the example associated with FIG. 5, the first user computer may be controlled by the engineering group and the first set of primitives may be executing a test plan for an engineering group.

At step 806, a second test plan is loaded to a control server from a second user computer, e.g., user computer 520. The second user computer may, for example, be under the control of a manufacturing group at the customer site.

At step 808, the second test plan is downloaded on a second set of primitives from the plurality of primitives for execution on the DUTs associated with the second set of primitives.

At step 810, the server executes the first test plan on the first subset of primitives and the second test plan on the second subset of primitives concurrently.

Figure 9:
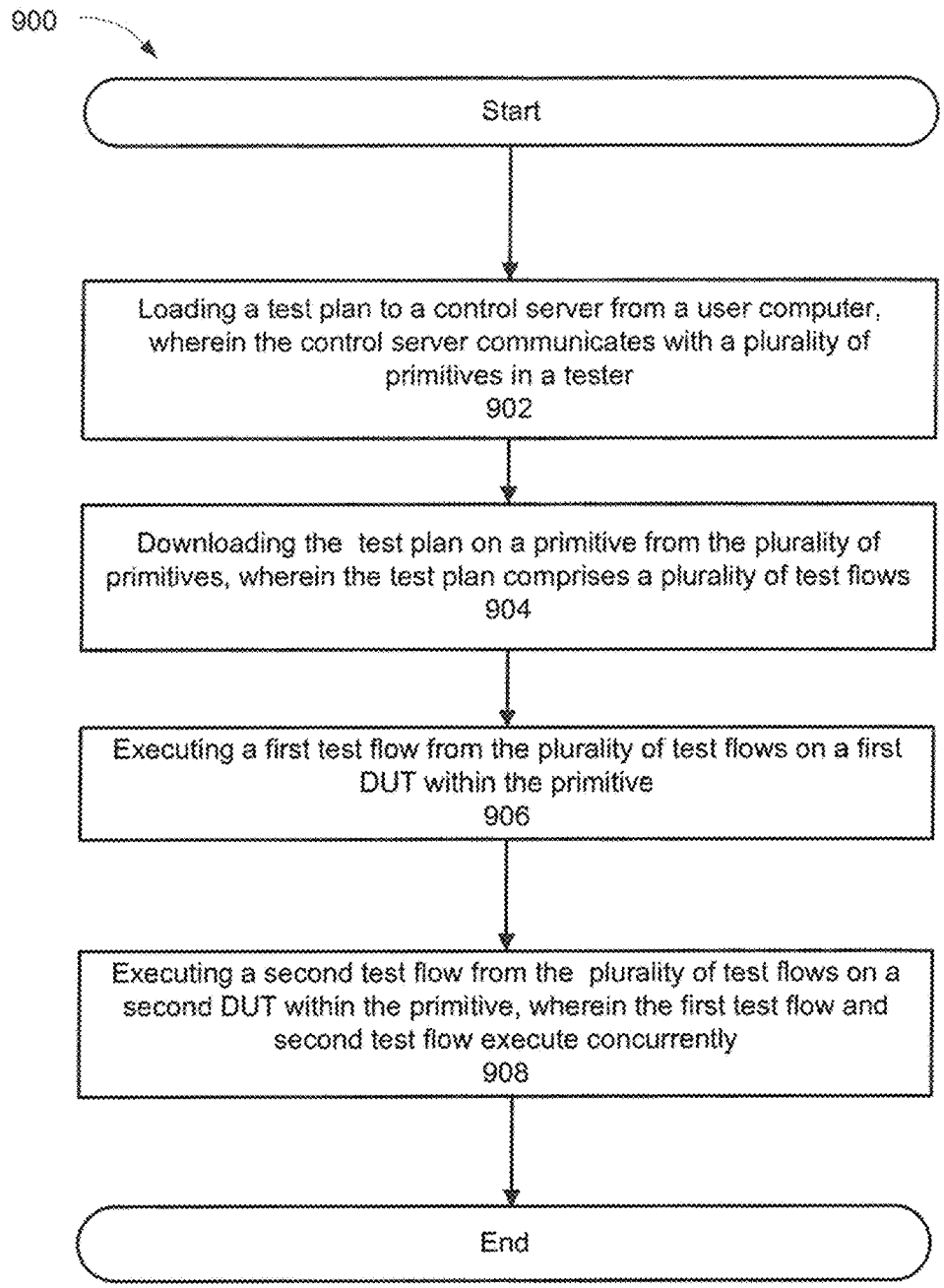
FIG. 9 illustrates a flowchart of an exemplary computer implemented process for running multiple test flows inside a single primitive on the same tester concurrently in accordance with one embodiment of the present invention.

FIG. 9 illustrates a flowchart of an exemplary computer implemented process for running multiple test flows inside a single primitive on the same tester concurrently in accordance with one embodiment of the present invention. The invention, however, is not limited to the description provided by flowchart 900. Rather, it will be apparent to persons skilled in the relevant art(s) from the teachings provided herein that other functional flows are within the scope and spirit of the present invention. Flowchart 900 will be described with continued reference to exemplary embodiments described above, though the method is not limited to those embodiments.

At step 902, a test plan is loaded to a control server, e.g., server 525 from a user computer, e.g., computer 510, wherein the control server is in communication with a plurality of primitives, e.g., primitives 540a-b in a tester. The control server will typically be running tester software, e.g., Advantest Stylus™ Operating System that allows it to communicate with the primitives and to run test plans on the DUTs inside the primitive.

At step 904, the test plan is downloaded on a primitive from the plurality of primitives for execution on the DUTs associated with the primitive. As mentioned above, in one embodiment of the present invention, a user is able to define a plurality of test flows within one STIL file of a test plan.

At step 906, a first test flow from the plurality of test flows is executed on a first DUT inside the primitive. At step 908, a second test flow from the plurality of test flows is executed on a second DUT inside the primitive, wherein the first test flow and the second test flow execute concurrently. As mentioned above, embodiments of the present invention improve upon conventional tester by allowing a user to define a plurality of test flows within one STIL file and running different test flows on each of the DUTs connected to a primitive (or tester slice). Each DUT in a primitive may run one of the defined test flows within the STIL file. While all DUTs connected to the same primitive may execute the same protocol and be under the control of the same user, embodiments of the present invention allow the DUTs on each primitive to run different test flows.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method for performing tests using automated test equipment (ATE), said method comprising:
   loading a test program to a control server from a user computer, wherein the control server communicates with a plurality of primitives in a tester, wherein the test program comprises a standard interface language (STIL) file, wherein the test program comprises a plurality of test flows, wherein the plurality of test flows are defined within the STIL file;

downloading the test program from the control server to a primitive of the plurality of primitives, wherein the primitive comprises an enclosure and test circuitry for executing the test program on a plurality of DUTs communicatively coupled to the primitive;

executing a first test flow from the plurality of test flows on a first DUT connected to the primitive; and concurrently executing a second test flow from the plurality of test flows on a second DUT connected to the primitive, wherein the first test flow and the second test flow are defined within the STIL file, and wherein each DUT in the primitive is configured to execute a respective test flow from the plurality of test flows defined in the STIL file.

2. The method of claim 1, further comprising:

executing a different test flow from the plurality of test flows defined in the STIL file on each DUT connected to the primitive concurrently.

3. The method of claim 1, wherein each test flow comprises a plurality of program sequences, wherein steps for the plurality of program sequences can be selected from the group consisting of: pre-processing steps, testing steps, post-processing steps and debugging steps.

4. The method of claim 3, wherein each program sequence comprises a plurality of segments, wherein each of the segments is operable to be tagged and identified using an identification number, wherein the identification number is used to perform execution order numbering for the plurality of test flows.

5. The method of claim 1, wherein the plurality of test flows can be edited by a user using a graphical user interface (GUI) running on the user computer.

6. The method of claim 1, wherein the plurality of test flows can be edited by a user using a GUI running on the control server.

7. The method of claim 1, wherein the plurality of test flows can be executed by a user using a GUI running on the user computer.

8. A system for performing an automated test, said system comprising:

a user computer operable to load a test program from a user to a control server, wherein the test program comprises a plurality of test flows, wherein the test program comprises a standard interface language (STIL) file, and wherein the plurality of test flows are defined the STIL file;

a tester deploying a plurality of primitives; and the control server, wherein the control server is communicatively coupled to the user computer and to the tester, wherein the control server is operable to download the test program to a primitive of the plurality of primitives, wherein the primitive comprises an enclosure and test circuitry for executing the test program on a plurality of DUTs communicatively coupled to the primitive, and wherein the control server is further operable to execute a first test flow from the plurality of test flows on a first DUT communicatively coupled the primitive and concurrently execute a second test flow from the plurality of test flows on a second DUT communicatively coupled the primitive, wherein the first test flow and the second test flow are defined within the STIL file, and wherein each DUT in the primitive is configured to execute a respective test flow from the plurality of test flows defined in the STIL file.

9. The system of claim 8, wherein the control server is further operable to execute a different test flow from the plurality of test flows defined in the STIL file on each DUT communicatively coupled the primitive concurrently.

10. The system of claim 8, wherein each test flow comprises a plurality of program sequences, wherein steps for the plurality of program sequences can be selected from the group consisting of: pre-processing steps, testing steps, post-processing steps and debugging steps.

11. The system of claim 10, wherein each program sequence comprises a plurality of segments, wherein each of the segments is operable to be tagged and identified using an identification number, wherein the identification number is used to perform execution order numbering for the plurality of test flows.

12. The system of claim 8, wherein the plurality of test flows can be edited by a user using a graphical user interface (GUI) running on the user computer, wherein the user computer is communicatively coupled with the control server using a standard IP connection.

13. The system of claim 8, wherein the plurality of test flows can be edited by a user using a GUI running on the control server.

14. The system of claim 8, wherein the plurality of test flows can be executed by a user using a GUI running on the control server.

15. A system for performing an automated test, said system comprising:

a user computer operable to load a test program from a user to a control server, wherein the test program comprises a plurality of test flows, wherein the test program comprises a standard interface language (STIL) file, and wherein the plurality of test flows are defined the STIL file;

a tester deploying a plurality of tester slices, wherein each tester slice is configured to execute the test program on a plurality of DUTs communicatively to a respective tester slice; and the control server, wherein the control server is communicatively coupled to the user computer and to the tester, wherein the control server is operable to download the test program to a tester slice of the plurality of tester slices, and wherein the control server is further operable to execute a first test flow from the plurality of test flows on a first DUT communicatively coupled the primitive and concurrently execute a second test flow from the plurality of test flows on a second DUT communicatively coupled the primitive, wherein the first test flow and the second test flow are defined the STIL file, and wherein each DUT in the primitive is configured to execute a respective test flow from the plurality of test flows defined in the STIL file.

16. The system of claim 15, wherein each test flow comprises a plurality of program sequences, wherein steps for the plurality of program sequences can be selected from the group consisting of: pre-processing steps, testing steps, post-processing steps and debugging steps.

17. The system of claim 16, wherein each program sequence comprises a plurality of segments, wherein each of the segments is operable to be tagged and identified using an identification number, wherein the identification number is used to perform execution order numbering for the plurality of test flows.

18. A method for performing tests using automated test equipment (ATE), said method comprising:

loading a first test plan to a control server from a graphical user interface on a first user computer, wherein the control server communicates with a plurality of primitives in a tester, wherein the plurality of primitives are deployed within a single rack in the tester wherein the first test plan comprises a standard interface language (STIL) file;

downloading the first test plan from the control server to a first subset of primitives from the plurality of primitives, wherein the first test plan comprises a first plurality of test flows, and wherein the first plurality of test flows are defined within the STIL file;

loading a second test plan to the control server from a graphical user interface of a second user computer;

downloading the second test plan from the control server to a second subset of primitives from the plurality of primitives, wherein the second test plan comprises a second plurality of test flows;

executing the first test plan and the second test plan concurrently;

executing a first test flow from the first plurality of test flows on a first DUT within a primitive of the first plurality of primitives wherein the primitive comprises an enclosure and test circuitry for executing the test program on a plurality of DUTs communicatively coupled to the primitive; and concurrently executing a second test flow from the first plurality of test flows on a second DUT the primitive of the first plurality of primitives, wherein the first test flow and the second test flow are defined within the STIL file, and wherein each DUT in the primitive is configured to execute a respective test flow from the first plurality of test flows defined in the STIL file.

19. The method of claim 18, further comprising:

while the first test plan is operating and the second test plan has completed execution:

loading a third test plan to the control server from a graphical user interface of a third user computer;

downloading the third test plan to a third subset of primitives from the plurality of primitives; and executing the first test plan and the third test plan concurrently.

* * * * *